United States Patent
Michalski

(10) Patent No.: US 9,584,068 B2
(45) Date of Patent: Feb. 28, 2017

(54) CIRCUIT ARRANGEMENT

(75) Inventor: Bernhard Michalski, Maulburg (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 295 days.

(21) Appl. No.: 14/350,470

(22) PCT Filed: Sep. 12, 2012

(86) PCT No.: PCT/EP2012/067795
§ 371 (c)(1),
(2), (4) Date: Apr. 8, 2014

(87) PCT Pub. No.: WO2013/053558
PCT Pub. Date: Apr. 18, 2013

(65) Prior Publication Data
US 2014/0253367 A1 Sep. 11, 2014

(30) Foreign Application Priority Data
Oct. 12, 2011 (DE) .......................... 10 2011 084 355

(51) Int. Cl.
*H03D 7/14* (2006.01)
*G01S 7/03* (2006.01)
(Continued)

(52) U.S. Cl.
CPC .......... *H03D 7/1458* (2013.01); *G01F 23/284* (2013.01); *G01S 7/032* (2013.01); *G01S 13/10* (2013.01); *G01S 13/88* (2013.01)

(58) Field of Classification Search
CPC ...... H03D 7/14; H03D 7/1425; H03D 7/1458; G01F 23/22; G01F 23/28; G01F 23/284;
(Continued)

(56) References Cited

U.S. PATENT DOCUMENTS

| 3,585,634 A | 6/1971 | Sharples |
| 4,425,793 A * | 1/1984 | Turton .................... G01S 13/88 342/124 |

(Continued)

FOREIGN PATENT DOCUMENTS

| DE | 602005003274 T2 | 9/2008 |
| EP | 0955527 A1 | 11/1999 |

(Continued)

OTHER PUBLICATIONS

Apr. 24, 2014 English Translation of IPR, WIPO, Geneva, Switzerland.

(Continued)

*Primary Examiner* — Bernarr Gregory
(74) *Attorney, Agent, or Firm* — Bacon & Thomas, PLLC

(57) ABSTRACT

A circuit arrangement for converting from a differential signal path ($IF_{out}A - IF_{out}B$) at the output of a mixer to a signal path ($S_{sin\ gle}$) referenced to a reference potential. A controllable switch element is provided in each of the two single signal paths ($IF_{out}A$, $IF_{out}B$) of the differential signal path ($IF_{out}A$-$IF_{out}B$), wherein a first memory element is connected in series with the two switch elements, and wherein there is provided for the two switch elements at least one control, which during a charging phase of the first memory element connects the differential signal path ($IF_{out}A$-$IF_{out}B$) at the output of the mixer with the first memory element and applies the output signal on the differential output of the mixer for charging the first memory element. During the discharging, respectively reverse charging, phase connects the first memory element with the signal path referenced to the reference potential (GND), so that charge stored in the first memory element is discharged via the signal path referenced to the reference potential (GND).

10 Claims, 2 Drawing Sheets

(51) Int. Cl.
*G01F 23/284* (2006.01)
*G01S 13/10* (2006.01)
*G01S 13/88* (2006.01)
*H03D 7/00* (2006.01)
*G01S 7/00* (2006.01)
*G01F 23/00* (2006.01)
*G01S 13/00* (2006.01)

(58) Field of Classification Search
CPC ... G01S 7/02; G01S 7/03; G01S 7/032; G01S 13/02; G01S 13/06; G01S 13/08; G01S 13/10; G01S 13/88; G01S 7/35
See application file for complete search history.

(56) References Cited

U.S. PATENT DOCUMENTS

| | | | | |
|---|---|---|---|---|
| 4,665,403 | A * | 5/1987 | Edvardsson | G01F 23/284 342/124 |
| 5,345,471 | A | 9/1994 | McEwan | |
| 5,973,637 | A * | 10/1999 | Perdue | G01F 23/284 342/124 |
| 6,078,280 | A * | 6/2000 | Perdue | G01F 23/284 324/629 |
| 6,087,978 | A | 7/2000 | Lalla et al. | |
| 6,191,724 | B1 * | 2/2001 | McEwan | G01S 7/35 342/118 |
| 6,535,161 | B1 * | 3/2003 | McEwan | G01F 23/284 342/118 |
| 7,145,384 | B2 | 12/2006 | Point et al. | |
| 7,633,434 | B2 | 12/2009 | Serban | |
| 8,026,760 | B1 | 9/2011 | Prasad | |
| 2008/0088179 | A1 | 4/2008 | Oyama et al. | |

FOREIGN PATENT DOCUMENTS

| | | |
|---|---|---|
| EP | 2045617 A1 | 4/2009 |
| EP | 2045617 B1 | 4/2009 |
| GB | 2094091 A | 9/1982 |
| WO | 2010021709 A1 | 2/2010 |
| WO | 2013053558 A1 | 4/2013 |

OTHER PUBLICATIONS

Nov. 23, 2012 International Search Report, EPO, The Netherlands.
Jan. 23, 2012 German Search Report, German Patent Office, Munich, Germany.
Nov. 1, 2006, DC-to-2.5 GHz High IP3 Active Mixer AD8343, XP055044475, pp. 1 -32, Found on the Internet on Nov. 16, 2012: URL:http://www.analog.com/static/imported-files/data_sheets/AD8343.pdf, Analog Devices, Inc.

* cited by examiner

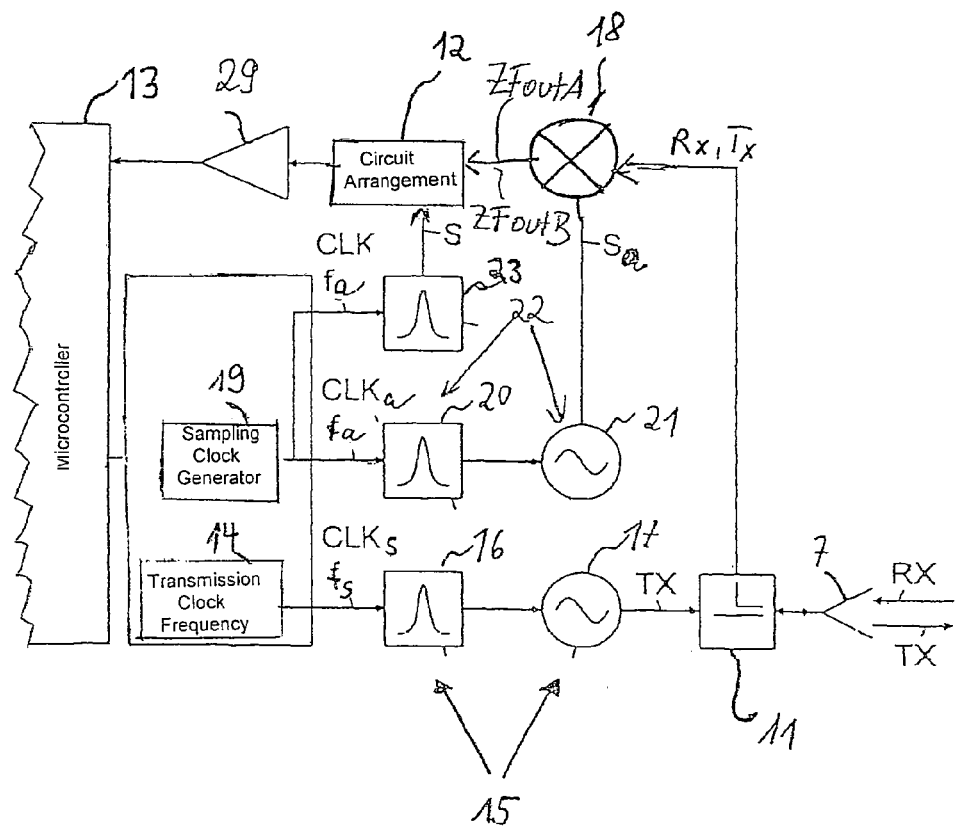
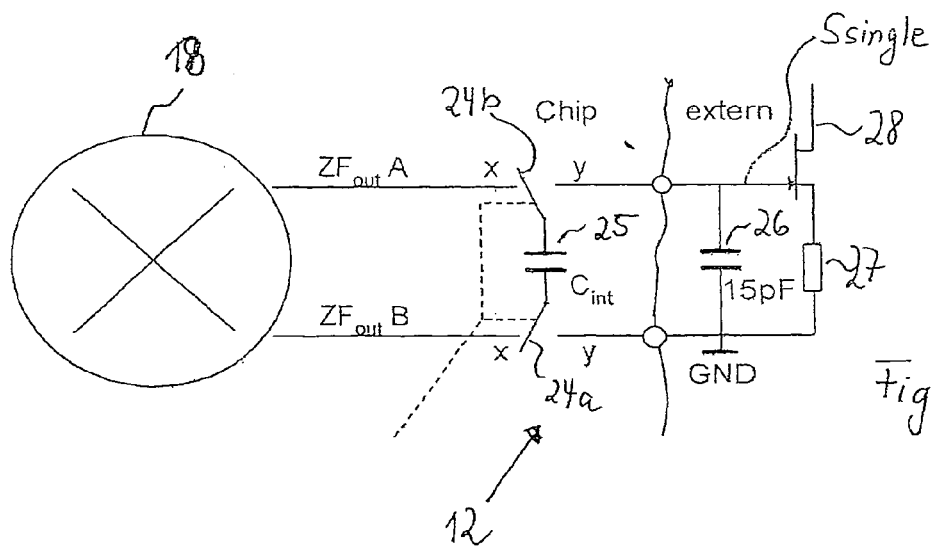

CIRCUIT ARRANGEMENT

TECHNICAL FIELD

The invention relates to a circuit arrangement for converting from a differential signal path at the output of a mixer to a signal path referenced to a reference potential. Furthermore, the invention relates to a pulse radar device, in which the circuit arrangement is used.

BACKGROUND DISCUSSION

Known are radar measuring devices for determining the fill level of a fill substance in a container work according to the travel-time difference method. Travel time difference methods utilize the physical law, according to which the travel distance equals the product of travel time and propagation velocity. In the case of fill level measurement, the travel distance corresponds to twice the separation between antenna and surface of the fill substance. The echo signal, thus the signal reflected on the surface of the fill substance, and its travel time, are determined based on the so-called echo function, respectively the digitized envelope curve, respectively the intermediate frequency curve, wherein these show the amplitudes of the echo signals as a function of the separation 'antenna —surface of the fill substance'. The fill level can then be ascertained from the difference between the known separation of the antenna from the floor of the container and the separation of the surface of the fill substance from the antenna determined by the measuring. Microwave measuring devices using pulse radar are sold by the assignee under the mark MICROPILOT®.

Known from European Patent, EP 2045617 B1 (U.S. Pat. No. 7,633,434) is a pulse radar device for determining or monitoring the fill level of a fill substance in a container. A transmission clock generator produces a transmission clock signal having a predetermined transmission clock frequency. A transmission pulse generator, which is triggered by the transmission clock signal, forwards transmission pulses with the transmission clock frequency to an antenna. The antenna radiates the transmission pulses in the direction of the surface of the fill substance and receives the echo signals reflected on the surface of the fill substance. The echo signals are sampled with a sampling clock frequency, which differs slightly from the transmission clock frequency. A sampling pulse generator, which is triggered by the sampling clock signal, produces the sampling pulses with the sampling clock frequency. For the purpose of producing an intermediate signal, the echo pulses are mixed with the transmission pulses in a mixer. Via an integrator, the intermediate frequency signal is integrated. The integrator is a sample/hold circuit, which has a switch and a capacitor. The switch is so designed that the intermediate frequency signal is sampled with the sampling clock frequency. This known circuit arrangement is scarcely implementable on a semiconductor chip.

SUMMARY OF THE INVENTION

An object of the invention is to provide a circuit arrangement for converting from a differential signal path at the output of a mixer to a signal path referenced to a reference potential, wherein the circuit arrangement is implementable in a simple manner on a semiconductor chip.

The object is achieved by a circuit arrangement having the following features:

a controllable switch element is provided in each of the two single signal paths of the differential signal path;
a first memory element is connected in series with the two switch elements;
there is provided for the two switch elements at least one control, which during a charging phase of the first memory element connects the differential signal path at the output of the mixer with the first memory element and applies the output signal on the differential output of the mixer for charging the first memory element, and which during the discharging, respectively reverse charging, phase connects the first memory element with the signal path referenced to the reference potential, so that charge stored in the first memory element is discharged via the signal path referenced to the reference potential.

Stated in summary, the solution of the invention describes the conversion of a differential signal at the output of a mixer to a single-ended circuit having a switch, capacitor configuration. An essential advantage of the circuit arrangement of the invention is that it can be implemented on a semiconductor-chip simply and cost effectively with minimal circuit complexity. preferably, the memory elements used in connection with the invention are capacitors. The reference potential is preferably the ground potential.

In a preferred embodiment of the circuit arrangement of the invention, there is provided parallel to the first memory element a second memory element, which is connected with one output to the reference potential, so that during the discharging, respectively reverse charging, phase charge stored in the first memory element is discharged to the second memory element.

An advantageous further development of the circuit arrangement of the invention provides that the mixer with the differential signal path, the two switch elements and the first memory element are arranged on a semiconductor chip. Alternatively, it is provided that the mixer with the differential signal path is arranged on a semiconductor chip.

Preferably, the circuit arrangement of the invention is used in connection with a pulse radar device for determining or monitoring the fill level of a fill substance in a container. The pulse radar device includes the following components:

a transmission clock generator for producing a transmission clock signal having a predetermined transmission clock frequency,
a transmission pulse generator, which is triggered by the transmission clock signal, in order to forward transmission pulses with the transmission clock frequency to an antenna,
the antenna, which radiates transmission pulses in the direction of the surface of the fill substance and which receives echo signals reflected on the surface of the fill substance,
a sampling clock generator for producing a sampling clock signal having a predetermined sampling clock frequency, which differs slightly from the transmission clock frequency,
a sampling pulse generator, which is triggered by the sampling clock signal, in order to produce sampling pulses having the sampling clock frequency,
a mixer for producing an intermediate signal by mixing the echo pulses with the transmission pulses,
an integrating unit for integrating the intermediate signal, wherein the integrating unit includes the circuit arrangement of the invention for converting from two differential signal paths at the output of the mixer to a signal path referenced to a reference potential. As already mentioned, the reference potential is preferably the ground potential. The memory elements are preferably embodied as capacitors.

Especially advantageous in connection with the invention is when the control and the two switch elements are so designed that the intermediate frequency signal is sampled with the sampling clock frequency.

The control is so designed in this connection that it controls the two switch elements simultaneously. Alternatively, two separate controls are provided, which simultaneously control the two switch elements. The switch elements are preferably electronic switches. For example, the electronic switches are constructed of CMOS transistors.

BRIEF DESCRIPTION OF THE DRAWINGS

The invention will now be explained in greater detail based on the appended drawing, the figures of which show as follows:

FIG. 2 is a schematic representation of an embodiment of the circuit arrangement of the invention; and FIG. 3 is an embodiment of the circuit arrangement of the invention.

DETAILED DISCUSSION IN CONJUNCTION WITH THE DRAWINGS

Figure 1:
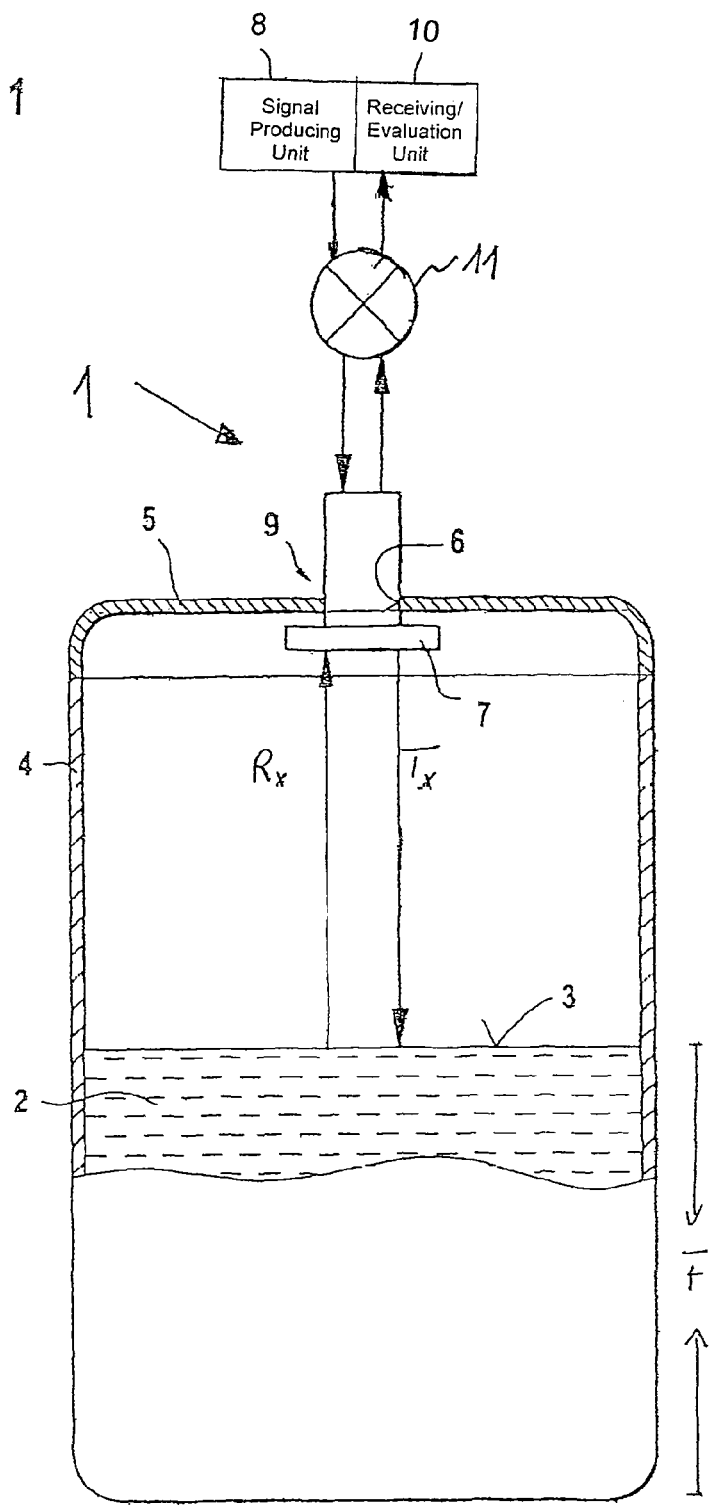
FIG. 1 is a schematic representation of a pulse radar device, in which the circuit arrangement of the invention is used.

FIG. 1 shows arranged on a container 4 a schematic representation of an embodiment of a pulse radar device 1, in the case of which the circuit arrangement 12 of the invention is preferably used. A fill substance 2 is stored in the container 4. Serving for determining the fill level F is the pulse radar device 1, which is mounted in an opening 6 in the lid 5 of the container 4. Via the antenna 7, high-frequency transmission pulses Tx produced in the signal producing unit 8 are sent, i.e. radiated, in the direction of the surface 3 of the fill substance 2. The transmission pulses are reflected on surface 3 partially as returning, echo pulses Rx. These returning echo pulses Rx are received in the receiving/evaluation unit 10 and evaluated via a travel-time difference method. The correct clocking of the transmission of the measuring pulses Tx and receiving of the echo pulses Rx occurs via the transmitting-receiving separator 11. Other terminology for separator 11 include "directional coupler" and "duplexer".

FIG. 2 shows a schematic representation of an embodiment of a pulse radar device 1, in the case of which the circuit arrangement 12 of the invention is used. Important components of a pulse radar device 1 are the signal producing unit 8 and the receiving/evaluating circuit 10.

Under the control of a microcontroller 13, the transmission clock generator 14 produces the transmission clock signal CLKs having a predetermined transmission clock frequency fs. The transmission clock frequency fs lies in the MHz-region. The transmission pulse generator 15, which is composed of a pulse shaper 16 and a transmission oscillator 17, is triggered by the transmission clock signal CLKs and forwards the transmission pulses Tx with the transmission clock frequency fs to the antenna 7. The antenna 7 radiates the transmission pulses Tx in the direction of the surface 3 of the fill substance 2; usually, antenna 7 also receives the echo pulses Rx reflected on the surface 3 of the fill substance 2. Of course, the transmitting and receiving antenna can also be embodied as separate units. The duration of the transmission pulses Tx lies in the ns range. A typical frequency for the transmission pulses Tx in the case of the pulse radar devices of the assignee lies at 26 GHz. The transmitting of the transmission pulses Tx and the receiving of the echo pulses Rx occurs via the transmitting/receiving separator 11 and the antenna 7.

The echo pulses Rx are fed to a mixer 18. A sampling clock generator 19 produces a sampling clock signal CLKa with a predetermined sampling clock frequency fa, which differs slightly from the transmission clock frequency fs. The sampling pulse generator 22 includes a pulse shaper 20 and an oscillator 21. The sampling pulse generator 22 is triggered by the sampling clock signal CLKa, and it produces sampling pulses Sa with the sampling clock frequency fa. The sampling pulses Sa have the same pulse form as the transmission pulses Tx.

The mixer 18 produces an intermediate frequency signal IF by mixing the echo pulses Rx with the transmitting pulses Tx, respectively Sa. The intermediate frequency signal IF is fed to an integrating unit 12, which corresponds to the circuit arrangement 12 of the invention. Produced via the control pulse generator 23 are control pulses S, which are fed to the integrating unit 12. The control pulses S are used to control the switch elements 24 of the circuit arrangement 12 of the invention with the sampling clock frequency fa and with a tunable time delay relative to the transmission pulses Tx. The output signal of the integrating unit 12 is fed to an amplifier 29. From the amplified signal present at the output of the amplifier 29, based on the travel-time difference of transmission pulses Tx and echo pulses Rx, the fill level F of the fill substance 2 in the container 2 is ascertained in the microcontroller 10.

FIG. 3 shows a preferred embodiment of the circuit arrangement of the invention, in the case of which a sample/hold circuit is involved. Circuit arrangement 12 of the invention is so embodied that the differential signal path $IF_{out}A$-$IF_{out}B$ at the output of the mixer 18 is converted to a signal path $S_{single}$ referenced to ground potential GND. The differential signal path $IF_{out}A$ -$IF_{out}B$, respectively the push-pull output, of the mixer 18 is continually low resistance. The advantage of a differential signal path $IF_{out}A$-$IF_{out}B$ with two single paths $IF_{out}A$, $IF_{out}B$ is, especially in the case of long lines, to be seen in the high disturbance resistance. A further advantage of the differential signal path $IF_{out}A$-$IF_{out}B$ at the output of the mixer 18 is that possibly occurring temperature drifts are compensated.

Provided in each of the two single signal paths $IF_{out}A$, $IF_{out}B$ of the differential signal path $IF_{out}A$, $IF_{out}B$ is, in each case, a controllable switch element 24a, 24b, which can be switched back and forth between two switch positions X, Y. The switch elements 24a, 24b are for example, CMOS transistors. Such switch elements are implementable as integrated circuits in every desired configuration.

Connected in series with the two switch elements 24a, 24b is a first memory element 25. The memory element is a capacitor. Actuation of the switch elements 24a, 24b occurs via the oscillator 23. During the active phase of the oscillator 23, the switch elements 24a, 24b are located in the switch position X, X, and the memory element 25 is charged to the signal level of the differential signal path $IF_{out}A$-$IF_{out}B$. After switching to the switch positions Y, Y, the lower switch 24a, and therewith the lower pole of the capacitor 25, is placed at the reference potential GND. The upper switch 24b transfers charge to the second capacitor 26. Thus, the second capacitor 26 receives charge from the first capacitor 25. The second capacitor 26 stores the charge until a new switching cycle is introduced. From the capacitor 26, the charge is then forwarded to the amplifier 29 via the signal path $S_{sin\ gle}$ referenced to the ground potential GND. Amplifier 29 is indicated in FIG. 3 by the transistor 28 and the resistor 27.

In the embodiment of the circuit arrangement 12 of the invention with two capacitors 25, 26, their capacitance values play a role. The capacitance values must be matched to the respective cases of application. Since the switch state X, X is very short, the first capacitor 25 is only a few pF, in order that it can be rapidly charged. The capacitance value of the second capacitor 26 depends mainly on with how many switching cycles the converted signal should reach its full level. The slower this should happen—the smaller thus is the measuring rate—the greater the capacitance value of the second capacitor 26 can be selected.

As already indicated based on the solution of the invention, the second capacitor 26 can even be omitted. This is possible, since the duty cycle of the switch positions X, X relative to the switch positions Y, Y is very extreme. The duty cycle lies, for example, approximately at 1:500. Stated generally, there exists here a difference of at least two orders of magnitude. Referenced to the preceding concrete case, this means that the switching state X, X is present for 1 ns. During this time, no signal is being input to the downstream electronics.

In contrast, the switch elements 24a, 24b remain in this concrete example in the switch position Y, Y for 500 ns. During this relatively long time, the first capacitor 25 performs also the task of the second capacitor 26, since the two are connected in parallel for the total length of time. For the short length of time of the switch positions X, X, the lowpass behavior of the downstream electronics can be used to integrate out the short interruption of the signal.

An option is also a third switching state Z, Z, in the case of which the first capacitor 25 is connected neither with the output of the mixer 18 nor with the second capacitor 26. In such case, the first capacitor 25 is basically not connected to anything. In this case, the second capacitor 26 is, in turn, required, in order to store the signal in the meantime. The duration of the residence in the switch position Z, Z can be used to minimize parasitic effects.

It remains to be mentioned that the dividing line in FIG. 3 indicates which components can be arranged, for example, on a semiconductor chip and which lie outside of the semiconductor chip.

The invention claimed is:

1. A circuit arrangement for converting from a differential signal path, $IF_{out}A - IF_{out}B$, at the output of a mixer to a signal path, $S_{sin\ gle}$, referenced to a reference potential, GND, comprising:
   a controllable switch element in each of the two single signal paths, $IF_{out}A$, $IF_{out}B$, of the differential signal path, $IF_{out}A-IF_{out}B$;
   a first memory element connected in series with said two switch elements; and
   at least one control provided for said two switch elements, which during a charging phase of said first memory element connects the differential signal path, $IF_{out}A - IF_{out}B$, at the output of the mixer with said first memory element and applies the output signal on the differential output of the mixer for charging said first memory element, wherein:
   during the discharging, respectively reverse charging, phase connects said first memory element with the signal path referenced to the reference potential, GND, so that charge stored in said first memory element is discharged via the signal path referenced to the reference potential, GND.

2. The circuit arrangement as claimed in claim 1, wherein: there is provided parallel to said first memory element a second memory element, which is connected with one output to the reference potential, GND, so that during the discharging, respectively reverse charging, phase charge stored in said first memory element is discharged to said second memory element.

3. The circuit arrangement as claimed in claim 1, wherein: the mixer with the differential signal path, said two switch elements and said first memory element are arranged on a semiconductor chip.

4. The circuit arrangement as claimed in claim 1, wherein: the mixer with the differential signal path is arranged on a semiconductor-chip.

5. The circuit arrangement as claimed in claim 1, wherein: the reference potential, GND, is the ground potential.

6. The circuit arrangement as claimed in claim 1, wherein: said memory elements are capacitors.

7. A pulse radar device for determining or monitoring the fill level of a fill substance in a container, comprising:
   a transmission clock generator for producing a transmission clock signal, CLKs, having a predetermined transmission clock frequency, fs, comprising:
   a transmission pulse generator, which is triggered by the transmission clock signal, CLKs, in order to forward transmission pulses, Tx, with the transmission clock frequency, fs, to an antenna;
   said antenna, which radiates transmission pulses, Tx, in the direction of the surface of the fill substance and receives the echo signals, Rx, reflected on a surface of the fill substance;
   a sampling clock generator for producing a sampling clock signal, CLKa, having a predetermined sampling clock frequency, fa, which differs slightly from the transmission clock frequency, fs;
   a sampling pulse generator, which is triggered by said sampling clock signal, CLKa, in order to produce sampling pulses (Sa) with the sampling clock frequency, fa;
   a mixer for producing an intermediate signal, IF, by mixing the echo pulses, Rx, with the transmission pulses, Sx; and
   an integrating unit for integrating the intermediate signal, IF, wherein:
   said integrating unit includes the circuit arrangement for converting from a differential signal path, $IF_{out}A-IF_{out}B$, at the output of a mixer to a signal path, $S_{single}$, referenced to a reference potential, GND, comprising: a controllable switch element in each of the two single signal paths, $IF_{out}A$, $IF_{out}B$, of the differential signal path, $IF_{out}A - IF_{out}B$; a first memory element connected in series with said two switch elements; and
   at least one control provided for said two switch elements, which during a charging phase of said first memory element connects the differential signal path, $IF_{out}A - IF_{out}B$, at the output of the mixer with said first memory element and applies the output signal on the differential output of the mixer for charging said first memory element, wherein: during the discharging, respectively reverse charging, phase connects said first memory element with the signal path referenced to the reference potential, GND, so that charge stored in said first memory element is discharged via the signal path referenced to the reference potential , GND, for converting from two differential signal paths, $IF_{out}A$, $IF_{out}B$, at the output of said mixer to a signal path referenced to a reference potential, GND.

8. The pulse radar device as claimed in claim 7, wherein:
said control and said two switch elements are so designed that the intermediate frequency signal, IF, is sampled with the sampling clock frequency, fa.

9. The pulse radar device as claimed in claim 7, wherein:
said control is so designed that it controls said two switch elements simultaneously.

10. The pulse radar device as claimed in claim 7, wherein:
two separate controls are provided, which simultaneously control said two switch elements.

\* \* \* \* \*